United States Patent [19]

Varaprath

[11] Patent Number: 4,696,834
[45] Date of Patent: Sep. 29, 1987

[54] SILICON-CONTAINING COATINGS AND A METHOD FOR THEIR PREPARATION

[75] Inventor: Sudarsanan Varaprath, Midland, Mich.

[73] Assignee: Dow Corning Corporation, Midland, Mich.

[21] Appl. No.: 835,029

[22] Filed: Feb. 28, 1986

[51] Int. Cl.$^4$ ............................................... B05D 5/12
[52] U.S. Cl. .................................... 437/223; 427/249; 427/255.2
[58] Field of Search ....................... 427/95, 86, 88, 93, 427/255.2; 423/324, 342, 345

[56] References Cited

U.S. PATENT DOCUMENTS

| | | | |
|---|---|---|---|
| 2,606,811 | 8/1952 | Wagner | 423/342 |
| 4,064,521 | 12/1977 | Carlson | 427/255.1 |
| 4,079,071 | 3/1978 | Neale | 423/324 |
| 4,374,182 | 2/1983 | Gaul | 427/226 |
| 4,459,163 | 7/1984 | MacDiarmid | 427/86 |
| 4,525,334 | 6/1985 | Woditsch | 423/324 |

FOREIGN PATENT DOCUMENTS

| | | |
|---|---|---|
| 3310828 | of 1984 | Fed. Rep. of Germany . |
| WO82/03069 | 9/1982 | PCT Int'l Appl. . |
| 2028289 | 5/1980 | United Kingdom ................ 423/342 |
| 2148328 | 5/1985 | United Kingdom . |

OTHER PUBLICATIONS

Easton et al, "The Plasma-Enhanced Deposition of Hydrogenated Amorphous Silicon", Vacuum, vol. 34, No's. 3-4, Mar.-Apr. 1984, pp. 371-376.
Harold Shafer, "Chemical Transport Reactions", 1984, p. 46.
Harold Shafer, Z. Znorg. Chem., 445, pp. 129-139, (1978).

Primary Examiner—John D. Smith
Assistant Examiner—Vi Duong Dang
Attorney, Agent, or Firm—Dennis H. Rainer

[57] ABSTRACT

The invention relates to the formation of silicon-containing coatings from the vapor phase thermal decomposition of halosilanes, polyhalodisilanes, polyhalosilanes or mixtures thereof in the presence of a metal catalyst. The instant invention also relates to the formation of silicon- and carbon-containing coatings and silicon- and titanium-containing coatings from the vapor phase thermal decomposition of alkyl halides and titanium halides, respectively, in the presence of a halosilane, polyhalosilane or halodisilane, and a metal catalyst.

12 Claims, No Drawings

SILICON-CONTAINING COATINGS AND A METHOD FOR THEIR PREPARATION

BACKGROUND OF THE INVENTION

Chemical vapor deposition (CVD) is one of the most widely used deposition processes to coat surfaces. Conventional CVD process is based on thermochemical reactions such as thermal decomposition, chemical reduction, displacement and disproportionation reactions. CVD reaction products find applications in a wide variety of fields; providing hard coatings on cutting tools, protecting surfaces against wear, erosion, corrosion, high temperature oxidation, high temperature diffusion, solid state electronic devices, preparation of fibers made of composite materials, and hermetic coatings.

A number of possible processes have been disclosed up to now for forming deposition films. For instance, for producing films of amorphous silicon deposit, there have been tried the vacuum deposition process, plasma CVD process, CVD process, reactive sputtering process, ion plating process and photo-CVD process, etc. Generally, the plasma CVD process is industrialized and widely used for this purpose.

However, deposition films of amorphous silicon still admit of improvements in overall characteristics including electrical and optical properties, various characteristics of fatigue due to repeated uses or to environmental use conditions. In addition, productivity of depositing silicon-containing films presents problems in product uniformity, reproducibility, and mass-production.

The conventional plasma CVD process, as compared with the conventional CVD process, is a complicated reaction process to deposit amorphous silicon and involves many unknown things in the reaction mechanism. The film formation in the plasma CVD process is affected by a number of parameters e.g., substrate temperature, flow rates and mixing ratio of feed gases, pressure during film formation, high frequency power used, electrode structure, structure of deposition chamber, rate of evacuation, and plasma generation method. These various parameters, combined with one another, sometimes cause an unstable plasma, which exerts marked adverse affects on the deposited film. In addition, the parameters characteristic of the deposition apparatus must be determined according to the given apparatus, so that it is difficult in practice to generalize the production conditions.

The conventional plasma CVD process is regarded at the present time as the best method for the purpose of obtaining amorphous silicon films which have such electrical and optical properties so as to fulfill various application purposes. However, the conventional plasma CVD process requires a high operational temperature and therefore is somewhat limited in applications and substrates.

Thus, there is a need for a process for producing silicon-containing films at low equipment cost and with acceptable film characteristics and uniformity.

Silicon-containing polymeric materials of silicon and hydrogen (hereafter referred to as a—SiH) have emerged as a new class of semiconductors in recent years. Such materials are described, for example, in D. Carlson, U.S. Pat. No. 4,064,521, issued on Dec. 20, 1976. The materials are generated as thin films from the decomposition of silane ($SiH_4$) in electrical discharges or, less frequently, from the thermal decomposition of silane or higher hydrogen-containing silanes (e.g., $Si_2H_6$, $Si_3H_8$, etc.) as described in a PCT patent application by A. MacDiarmid and Z. Kiss published as International Publication No. WO 82/03069 dated Sep. 16, 1982.

U.S. Pat. No. 4,459,163, issued Jul. 10, 1984 to MacDiarmid and Kiss, teaches the preparation of amorphous semiconductor material that is suitable for use in a wide variety of devices by the pyrolytic decomposition of one or more gaseous phase "polysemiconductanes," including polysilanes and polygermanes. However, U.S. Pat. No. 4,459,163 is directed toward the formation of semiconductor material only; is based on polysilane precursors; does not utilize a metal catalyst, and does not address the use of halosilanes.

When it is desirable to include additional elemental constituents in silicon-containing films, co-reactants such as phosphine ($PH_3$) or diborane ($B_2H_6$) are added to the starting materials. When fluorine is to be incorporated into an silicon-containing film, tetrafluorosilane ($SiF_4$) is most commonly added to the reactant mixture. This is described for example in U.S. Pat. No. 4,217,374 granted to Ovshinsky and Izu on Aug. 12, 1980.

U.S. Pat. No. 4,374,182, issued Feb. 15, 1983 to Gaul et. al., discloses decomposing halogenated polysilanes at an elevated temperature to prepare silicon. Gaul et al., however, teaches the pyrolysis of polychlorosilanes in the presence of tetrabutylphosphonium chloride catalyst. This distinguishes Gaul et al. from the instant invention directed to silicon-containing coatings produced from halosilanes, disilanes, or mixture of halosilanes in the presence of certain metal catalysts. Gaul et al. does not use metals as catalysts.

U.S. Pat. Nos. 2,606,811, issued on Aug. 12, 1952 to Wagner and 4,079,071, issued on Mar. 14, 1978 to Neale, address the decomposition at elevated temperatures of halogenated disilanes. However, Neale and Wagner are directed toward the reductive hydrogenation of di- and polysilanes for the formation of silanes, and more specifically, monosilanes. Neither Wagner nor Neale teach the vapor phase deposition of silicon-containing films from the thermal decomposition of halosilanes in the presence of certain metal catalysts as taught in the instant invention.

United Kingdom Pat. No. 2,148,328, issued to M. Hirooka, et al., on May 30, 1985, teaches the decomposition of various silanes, including monomeric halosilanes ($Si_nX_{2n+1}$, where $n=1$), cyclic polymeric halosilanes ($SiX_2)_n$, where n is greater than or equal to 3, di- and polysilanes such as $Si_nHX_{2n+1}$ and $Si_nH_2X_{2n}$. These materials are decomposed via electric discharge, or photolysis, or high temperature or catalyst and, unlike the instant invention, are mixed with a requisite second stream consisting of a vapor phase material selected from the group consisting of $H_2$, $SiH_4$, $SiH_3Br$, or $SiH_3I$, wherein the second stream has also been decomposed. The obvious disadvantage of such prior art, one which clearly distinguishes it from the instant invention, is the necessity of having two materials to decompose. The Hirooka, et al. patent requires the second stream as the source of hydrogen to facilitate the reduction of the silane to the amorphous silicon. The instant invention, however, can have hydrogen present, if desired, and silicon in the single stream of halosilane to produce the desired silicon-containing coating but, hydrogen is not required. Hirooka et al. does not teach the use of the metal catalysts of the instant invention. Hirooka et al.

does disclose the nonessential use of undefined heterogeneous or homogeneous catalysts for the formation of the requisite activated species used as the source of the hydrogen. Hirooka et al. does not teach that the undefined catalysts assist the deposition of the amorphous silicon film, but rather, that the catalysts of Hirooka et al. assist in the formation of the activated species described therein.

Woditsch et al. in the German patent DE No. 3310828-A, issued in 1984, describe the production of silicon for solar cell manufacture by reacting gaseous silane, halosilane or silicon halide with solid aluminum. The reaction temperature is below that of the melting point of aluminum and preferably 500 to 650 degrees C. The preferred silicon compound is silicon tetrachloride and the aluminum is in finely-divided form with a specific surface area of over 0.05 m$^2$/g. See also U.S. Pat. No. 4,525,334, issued Jun. 25, 1985, to Woditsh, et al.

H. Schafer, in his book titled "Chemical Transport Reactions," p. 46, (Academic Press, 1964) has described specific examples where metals including iron, cobalt, nickel and copper have been reduced and transported through a vapor phase to form a lustrous mirror on the walls of the reaction vessel.. Shafer also reports the deposition of thin silicon foils with metallic luster on a quartz reactor vessel wall when using aluminum in the presence of aluminum chloride ($Al_2Cl_3$). (H. Shafer, Z. anorg. Chem., 445, 129–139 (1978)).

SUMMARY OF THE INVENTION

The instant invention relates to the formation of silicon-containing coatings from the vapor phase thermal decomposition of halosilanes, polyhalodisilanes, polyhalosilanes or mixtures thereof in the presence of a metal catalyst. The instant invention also relates to the formation of silicon- and carbon-containing coatings from the vapor phase thermal decomposition of alkyl halides or mixtures thereof in the presence of a halosilane, polyhalo silane, or halodisilane, and a metal catalyst. The metal catalyst can be in the form of a film or foil and the presence of the metal catalyst allows the chemical vapor deposition film formation to proceed at temperatures lower than those required for conventional chemical vapor depositions.

DETAILED DESCRIPTION OF THE INVENTION

The present invention relates to a method of forming silicon-containing coatings on a solid substrate, which method comprises decomposing in a reaction chamber, a halosilane, halodisilane or mixture of halosilanes in the vapor phase, in the presence of a metal catalyst and a substrate, at a temperature in the range of 400 degrees to 600 degrees Centigrade, wherein the halosilanes and halodisilanes, each contain at least one halogen atom selected from the group consisting of fluorine, chlorine, bromine, and iodine, and wherein the metal catalyst is selected from the group consisting of aluminum, chromium, magnesium, stainless steel, copper and zirconium, whereby a substrate containing a coating thereon is obtained. The instant invention produces highly colored, reflective, air-stable silicon-containing coatings from the vapor phase decompositon of various halosilanes in the presence of certain metal catalysts. The coatings produced by the instant invention exhibit strong adhesion to substrates, are abrasion resistant, and are strong absorbers of visible light. The invention further relates to a method of making a scratch resistant protective coating on a substrate which method comprises decomposing in a reaction chamber, a halosilane, halodisilane, or mixture of halosilanes in the vapor phase, in the presence of a metal catalyst, at a temperature in the range of 400 degrees to 600 degrees Centigrade, wherein the halosilanes and halodisilanes, each contain at least one halogen atom selected from the group consisting of fluorine, chlorine, bromine, and iodine, and wherein the metal catalyst is selected from the group consisting of aluminum, chromium, magnesium, stainless steel, copper, and zirconium, whereby a substrate containing a coating thereon is obtained. The present invention also relates to a method of making a high temperature resistant coating on a substrate which method comprises decomposing in a reaction chamber, a halosilane, halodisilane, or mixture of halosilanes in the vapor phase, in the presence of a metal catalyst, at a temperature in the range of 400 degrees to 600 degrees Centigrade, wherein the halosilanes and halodisilanes each contain at least one halogen atom selected from the group consisting of fluorine, chlorine, bromine, and iodine, and wherein the metal catalyst is selected from the group consisting of aluminum, chromium, magnesium, stainless steel, copper, and zirconium, whereby a substrate containing a coating thereon is obtained. In addition, the invention relates to a method of making a photoconductive coating, semiconductive coating, or hermetic coating on a substrate which method comprises decomposing in a reaction chamber, a halosilane, halodisilane, or mixture of halosilanes in the vapor phase, in the presence of a metal catalyst, at a temperature in the range of 400 degrees to 600 degrees Centigrade, wherein the halosilanes and halodisilanes each contain at least one halogen atom selected from the group consisting of fluorine, chlorine, bromine, and iodine, wherein the metal catalyst is selected from the group consisting of aluminum, chromium, magnesium, stainless steel, copper, and zirconium, whereby a substrate containing said photoconductive coating, semiconductive coating, or hermetic coating thereon is obtained.

Because of the presence of the metal catalyst of the instant inventive process, the formation of silicon-containing coatings can be achieved at temperatures lower than those utilized in conventional chemical vapor phase depositions. What is meant by "silicon-containing" coatings in this invention are those coatings which are predominantly amorphous silicon, it being recognized that under certain reaction conditions, some crystalline silicon is also formed. In this invention, CVD is carried out in the presence of a metal catalyst, such as aluminum, present in the form of thin foil. "Metal catalysts," for purposes of this invention means metals in the free state, preferably in thin foil form. The metal catalyst assists in the decomposition of halosilanes and the subsequent deposition of a silicon-containing coating on an available substrate. This new CVD process is efficient and utilizes inexpensive metal catalyst, such as aluminum, to facilitate the deposition of the coating or film. The silicon-containing coating can be obtained at relatively low reaction temperature by the metal-assisted CVD process of the instant invention. The high temperature conditions of the conventional CVD technique normally limit the type of substrate materials which can be coated. The choice of substrates to be coated by the instant invention is limited only by the need for thermal and chemical stability at the decomposition temperature in the atmosphere of the decomposition vessel. Thus the substrate to be coated can be, for example, but is not limited to, various types of glass, metals, such as aluminum and steel, and plastics able to withstand the temperatures, or salts, such as sodium chloride.

As a result of metal assistance in the CVD process of the instant invention, the rate of deposition of the silicon-containing coating can be significantly increased over that of conventional CVD process.

The instant invention differs from Woditsch et al. in that Woditsch et al. uses aluminum in the form of a fine powder with high surface area to facilitate complete chemical reaction of the aluminum. Thus, aluminum is totally consumed in a stoichiometric amount by the reaction with silicon halides under the teaching of Woditsch et al. and what is produced is silicon metal of a particle size equal to that of the aluminum powder. In the reactions of the instant invention, aluminum is supplied in the form of a thin foil and is used to activate silicon halides so as to catalytically initiate the deposition of silicon-containing coatings. The aluminum foil used in the deposition process of the instant invention can be cleaned and reused. In addition, the deposition product obtained under Woditsch et al. is silicon metal, while in the instant invention the coating deposited in the presence of aluminum foil contains silicon and some halogen atoms.

The instant invention differs from that described by Schafer who teaches the use of aluminum metal and aluminum compounds such as $AlCl_3/Al_2Cl_6$ in order to generate the reactive AlCl species. Further, the material being reduced in Schafer is $SiO_2$. A source for such quartz is the reaction vessel walls. The present invention does not require $AlCl_3$ or $Al_2Cl_6$. The halosilanes being used as the source of silicon react with the solid aluminum catalyst to generate AlCl species. In the reactions of the instant invention, it is the halosilanes which provide the source of the silicon atoms for the silicon-containing coating being deposited. Thus silicon-containing coatings have been conveniently deposited by the instant invention on a variety of substrates such as aluminum, sodium chloride and silicon to demonstrate that the silicon source is not $SiO_2$ but rather the halosilane. The ability to coat silicon surfaces, such as a silicon wafer, by the present invention is very useful in the production of electronic devices. If $SiO_2$ is the source of silicon, silicon-containing coating deposition would cease after a few monolayers of surface $SiO_2$ are reduced, regardless of the monomer concentration. Thus, Schafer's method is limited, in that, once the surface $SiO_2$ is reduced by the AlCl species, the deposition will cease. Furthermore, the coating thickness in Schafer remains essentially constant in each coating deposition also proving that the $SiO_2$ is the silicon source. The process of the present invention provides coatings of thicknesses which can be varied as desired depending upon the concentration of the silicon halides that are being reduced. Thus, by the instant invention, increasing the silane starting material vapor phase concentration three-fold results in a two-fold increase in the thickness of amorphous silicon deposited. The vapor pressure of the silane starting material can vary from 2 mm Hg to 2 Torr. The instant invention is therefore much more practical as a method of producing silicon-containing coatings.

The halosilanes possessing more than one type of halogen which are serviceable in the present invention for the production of silicon-containing coatings can be described as those of the formula $SiX_mY_{(4-m)}$ where X and Y are selected from the group consisting of fluorine, chlorine, bromine, and iodine. Other examples of halosilanes which can be utilized in the instant invention include the following and mixtures thereof:

|       | $SiCl_4$   |          | $SiBr_4$   |
|-------|------------|----------|------------|
| $HSiI_3$ | $HSiCl_3$  | $HSiF_3$ | $HSiBr_3$  |
| $H_2SiI_2$ | $H_2SiCl_2$ | $H_2SiF_2$ | $H_2SiBr_2$ |
| $H_3SiI$ | $H_3SiCl$  | $H_3SiF$ | $H_3SiBr$  | as well as halosilanes with more than one type of halogen such as $Cl_2SiF_2$, $ClSiF_3$, $Cl_2SiBr_2$, $F_2SiBr_2$, and $Cl_2SiI_2$. Also serviceable in the present invention are halogenated disilanes, such as, for example, $F_3SiSiF_3$.

In the present invention, the preferred vapor pressure range for the halosilane starting materials is from 2 mm Hg to 2 Torr. A more preferred range is from 5 mm Hg to 300 mm Hg. The most preferred vapor pressure range for the halosilane starting materials is from 10 mm Hg to 100 mm Hg.

Thus, an example of the instant invention can be depicted in the following equation;

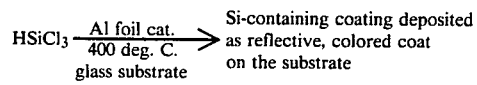

The silicon-containing coatings of the present invention exhibit excellent thermal stability.

The instant invention can be utilized to derive silicon-containing coatings from iodosilanes which under the conventional CVD process simply decompose to yield undesired solid products.

In the conventional CVD process of the prior art, fully halogenated silane monomers, such as $SiCl_4$, resist silicon-containing coating deposition except under reducing conditions, such as a hydrogen atmosphere. Application of the instant invention, however, using $SiCl_4$ results in silicon-containing coating deposition containing no dangling silicon-hydrogen moieties.

Under the teachings of the prior art, a single material most often will not suffice to meet the ever increasing demands of specialty coating applications, such as electronics. Several coating properties such as microhardness, ductility, tensile strength, thermal expansion coefficients, etc., often need to be altered depending on the requirements of the application. In these instances, doping or depositing mixed metals or metal compounds have to be considered. The instant invention also relates to a method of forming a titanium silicide coating on a solid substrate which method comprises decomposing in a reaction chamber essentially simultaneously (A) a halosilane, halodisilane, or mixture of halosilanes, and (B) a titanium halide or mixture of titanium halides in the vapor phase, in the presence of a metal catalyst, and a solid substrate, at a temperature in the range of 400 degrees to 600 degrees Centigrade, wherein the titanium halides and halosilanes and halodisilanes each contain at least one halogen atom selected from the group consisting of fluorine, chlorine, bromine, and iodine, wherein the metal catalyst is selected from the group consisting of aluminum, chromium, magnesium, stainless steel, copper and zirconium, whereby said coating is formed on said substrate. What is meant by "titanium silicide" coating in this invention are those coatings which are predominantly composed of titanium and silicon, it being recognized that, under certain reaction conditions, some halogens remain attached to titanium and silicon. The metal-assisted CVD technique of the present invention provides for the simultaneous deposition of other metals along with silicon. Thus silicon tetrachloride and titanium tetrachloride can be codeposited on substrates such as glass by CVD in the presence of aluminum foil to produce metallic silver-colored coatings. Unlike the coatings obtained from chlorosilane monomers alone, which are golden in color, the codeposition of halides and silicon halides results in coatings which are silvery in appearance and distinctly different in color.

By the instant invention one can also codeposit carbon and silicon by using appropriate alkylhalides and silicon halides. The instant invention relates to a method of forming a silicon carbide coating on a solid substrate which method comprises decomposing in a reaction chamber essentially simultaneously (A) a halosilane, halodisilane, or mixture of halosilanes in the vapor phase, wherein the halosilanes and halodisilanes each contain at least one halogen atom per molecule selected from the group consisting of fluorine, chlorine, bromine, and iodine, and (B) alkyl halide or mixture of alkyl halides wherein the alkyl halides or each alkyl halide contains at least one halogen atom per molecule selected from the group consisting of fluorine, chlorine, bromine, and iodine, in the vapor phase, in the presence of a metal catalyst and a substrate, at a temperature between 400 degrees and 600 degrees Centigrade, wherein the metal catalyst is selected from the group consisting of aluminum, chromium, magnesium, stainless steel, copper, and zirconium, whereby a substrate containing a coating thereon is obtained. What is meant by "silicon carbide" coating in this invention are those coatings which are predominantly composed of carbon and silicon, it being recognized that under certain reaction conditions, some halogens remain attached to carbon and silicon.

The assistance rendered by a metal in the deposition or codeposition of a silicon-containing coating by CVD is not unique to aluminum. The present invention includes the catalysis of the CVD process with metals other than aluminum, including chromium, stainless steel, copper, magnesium, and zirconium. Several metals were found, under certain conditions, to not produce a catalytic effect by the present invention. These metals include platinum, indium, nickel, molybdenum, and titanium. While aluminum foil did have a catalytic effect, aluminum iodide ($AlI_3$) and aluminum chloride ($AlCl_3$) did not. Copper metal produced a catalytic effect on the CVD of a coating from diiodosilane at a starting vapor pressure of 5 mm Hg and 550° C., but copper metal did not produce a catalytic effect on the CVD of silicon tetrachloride at 65 mm Hg and 500° C.

In general, in the practice of the instant invention, a halosilane, or mixtures of various halosilanes are placed in a glass container, along with a substrate to be coated with a silicon-containing coating and the metal catalyst in the form of, for example, aluminum foil. The choice of substrates is limited only by the need for thermal and chemical stability at the decomposition temperature in the atmosphere of the decomposition vessel. Thus the substrate to be coated can be, for example but is not limited to, various types of glass, metals and plastics able to withstand the temperatures. Both the deposition vessel and substrate are preferably first cleaned (e.g., in an alkaline detergent) and rinsed with a highly purified solvent, preferably water or "electronic grade" methanol. The deposition vessel is then attached to a vacuum line, the contents evacuated, and the vessel thoroughly heated under vacuum with, for example, a gas-oxygen torch. A halosilane, for example, is transferred to the glass decomposition vessel in such a manner as to preclude exposure to the atmosphere. The vessel is sealed with a natural gas-oxygen torch and heated in an oven or furnace for a time generally in the range of 10 to 60 minutes at a temperature in the range of from 400 degrees Centigrade to 600 degrees Centigrade and preferably in the range of from 400 degrees Centigrade to 450 degrees Centigrade. During this time, the silane starting material decomposes and forms a silicon-containing coating on the substrate. Then, the reaction by-products, mixtures of various halosilanes, hydrogen (if the starting material contained $\equiv$SiH) and any unreacted starting material, may conveniently be removed by evacuation after the vessel has been reattached to the vacuum line. The substrate, onto which the decomposed halosilane starting material has deposited a silicon-containing coating, is then removed. The resulting coatings are highly colored, reflective, air-stable, abrasion resistant, photoconductive, semiconductive silicon-containing coatings possessing high thermal stability, low defect density and high dopability.

Silicon-containing coatings prepared from difluorosilane by the metal assisted instant invention have band gaps comparable to those of conventional amorphous $\equiv$SiH containing coatings, but are not degraded phenomenologically, chemically, or electrically at temperatures where coatings of the purely hydrogenated silicon material are destroyed.

The tetrahalomonosilanes ($X_4Si$, where X is selected from the class consisting of chlorine, bromine, and iodine) and monohalomonosilanes ($XSiH_3$) are not effective thermal sources of silicon-containing coatings in conventional CVD processes and CVD plasma processes for these applications, without an additional source of hydrogen and/or halogen. The present invention, using these halosilanes in the presence of the metal catalyst to produce silicon-containing coatings, is unique and unobvious.

Coatings produced by the instant invention are useful as semiconducting materials in photovoltaics, passive optical layers, corrosion resistant coatings, and abrasion resistant coatings, hermetic coatings, semiconductor devices, high temperature resistant coatings, among other applications.

For evaluation in the following examples, diiodosilane was prepared as follows. Diphenylsilane (1 equivalent) was placed in a heavy walled Pyrex ® tube (10"×1") equipped with a teflon valve with a Viton ® "O" ring. The system was cooled in liquid nitrogen and degassed. Dry hydrogen iodide gas (6 equivalents) was condensed into the pyrex tube. The pyrex tube was closed and kept cold in an ethylene glycol/dry ice bath for six days. The reaction vessel was periodically removed from the cold bath and shaken. After the reaction had progressed for six days, excess hydrogen iodide was removed by distillation at 120 mm Hg pressure. The by- product benzene was removed at 30 mmHg pressure. A colorless liquid product remained which was verified by proton NMR to be diiodosilane (singlet at 4.10 ppm. for SiH).

The Pyrex ® container and the 7059 Corning glass slides used in the following examples of the deposition process of the instant invention were cleaned using "DeContam" (manufactured by Electronic Space Products, Inc., Los Angeles, Calif.) following the manufacturer's directions. The container and the slides were either soaked in the "DeContam" solution (200 milliliters of "DeContam" in 1 quart of water) for about 3-5 hours at room temperature or kept in a boiling solution for a few minutes before thoroughly rinsing with deionized water. After the water was decanted, the objects were dried in an oven. Aluminum foil, cut to fit the inside wall of the Pyrex ® tube, was cleaned successively with toluene and isopropyl alcohol, and dried using aerosol duster (dichlorodifluoromethane gas).

EXAMPLES

Example 1

Metal Assisted CVD Process in Closed Container

The inside of a heavy walled Pyrex ® container was covered with the cleaned aluminum foil. A glass slide was placed inside the container. The container and its contents were flame dried under vacuum. After the container and the contents attained room temperature, the container was filled with the appropriate halosilane monomer at the desired vapor pressure. (See Tables I and II.) The system was isolated from the rest of the vacuum line, cooled in a liquid nitrogen bath, and degassed. The container was sealed under vacuum ($10^{-5}$ mm), placed in a tube furnace and heated for an hour to the desired temperature. The process resulted in the formation of a highly reflective and multicolored (mostly golden in appearance) silicon-containing coating on the surface the glass slide and the Pyrex ® container. The amount of silicon-containing coating deposited on the substrate is directly related to the vapor pressure in the reaction vessel of the starting silane, as shown in Table I.

TABLE I

| Starting Material | Vapor Pressure | Conditions | Temperature | Coating Thickness |
|---|---|---|---|---|
| SiCl$_4$ | 65 mm Hg | Aluminum foil catalyzed | 550° C. | 700 A |
| SiCl$_4$ | 135 mm Hg | Aluminum foil catalyzed | 550° C. | 1000 A |
| SiCl$_4$ | 195 mm Hg | Aluminum foil catalyzed | 550° C. | 1400 A |
| H$_2$SiCl$_2$ | 65 mm Hg | Aluminum foil catalyzed | 434° C. | 700 A |

The silicon-containing coating deposited by this method from H$_2$SiCl$_2$ starting material exhibited no detectable aluminum by electron spectroscopy for chemical analysis (ESCA) and had a Si/Cl ratio of 1:0.006. This differs significantly from the prior art in which such coatings obtained by conventional CVD processes are known to contain 5-10% chlorine. The lower chlorine content of the coatings of the instant invention can be expected to impart greater environmental stability to the coatings.

Example 2

Metal Assisted CVD Process in a Flow Reactor

A quartz tube with an inlet port and outlet port was positioned in a tube furnace. The inlet port was attached to the source of the silicon tetrachloride monomer and the outlet port was connected to a digital manometer and to a vacuum line through a series of cold traps. The quartz tube served as the reaction vessel and was lined with the cleaned aluminum foil through its entire length. A glass slide was inserted into the lined reaction vessel to serve as the substrate to be coated. The reaction vessel and its contents were heated to the deposition temperature of 434° C. before admitting the silicon tetrachloride monomer. The silicon tetrachloride monomer was then fed into the quartz glass reaction vessel continually by applying vacuum. The vapor pressure of the silicon tetrachloride monomer, recorded by the digital manometer, was controlled by micrometer valves on the outlet port of the reaction vessel. The vacuum in the main vacuum line was generally held to around $10^{-4}$ mm. Volatile by-products were trapped at liquid nitrogen temperatures in the cold traps. The flow of the halosilane monomer was continued until the desired coating thickness on the glass substrate was obtained. The resulting coating was highly reflective and golden in appearance. The coating showed no visible degradation after 60 hours at 600 degrees C. in nitrogen atmosphere and after 24 hours at 600 degrees C. in air. No visible effect was detected in the coating after immersion in concentrated sulfuric acid, nitric acid, and hydrogen chloride for thirty days each at room temperature. The coating exhibited a pencil hardness of 9H and environmental stability toward air and moisture.

Example 3

Using the CVD procedure described in Example 1, silicon tetrachloride and titanium tetrachloride were thermally decomposed in the presence of aluminum foil catalyst to codeposit metallic silvery coatings on glass substrates.

Silicon tetrachloride and titanium tetrachloride were combined, at vapor pressures of 20 mm Hg each, in a reaction vessel heated to 550° C. and lined with aluminum foil cleaned by the method described above. Using the procedure described in Example 1, a metallic silvery coating containing titanium and silicon was produced. ESCA analysis indicated, by way of low chlorine content of the coating, that the silicon and titanium had been reduced.

In a similar manner, dichlorosilane and titanium tetrachloride were thermally decomposed at 450° C. to deposit on glass substrates by CVD in the presence of aluminum foil catalyst metallic silver-colored coatings. ESCA data from the coating produced by the CVD codeposition of SiCl$_4$ and TiCl$_4$ indicated the coating contained titanium silicide.

Example 4

Using the CVD procedure described in Example 1, dichlorosilane and dichloromethane were thermally decomposed in the presence of aluminum foil catalyst to produce a metallic grey coating on the substrates. Dichlorosilane and dichloromethane were combined at 30 mm Hg each in a reaction vessel heated to 450° C. in the presence of aluminum foil. By this CVD method was produced a metallic grey coating on a glass substrate. ESCA data from the coating produced by the CVD thermal decomposition of dichlorosilane and dichloromethane in the presence of aluminum foil catalyst indicated silicon and carbon present in their reduced forms as silicon carbide.

TABLE II
Silicon-Containing Coating Produced by Metal-Assisted CVD Process

| Silane Monomer | Metal Catalyst | Monomer Concentration $P_{monomer}$, mm | Pyrolysis Condition °C. | Results Silicon-Containing Coating |
|---|---|---|---|---|
| $H_2SiI_2$ | Al | 10 | 550 | x |
| $H_2SiI_2$ | Cu | 5 | 550 | x |
| $H_2SiI_2$ | Cr | 5 | 550 | x |
| $H_2SiI_2$ | Stainless Steel | 5 | 550 | x |
| $H_2SiCl_2$ | Al | 65 | 434 | x |
| $HSiCl_3$ | Al | 65 | 434 | x |
| $SiCl_4$ | Al | 65 | 550 | x |
| $HSiCl_3$ | Mg | 65 | 440 | x |
| $SiCl_4$ | Zr | 65 | 550 | x |

P is the pressure in millimeters of mercury of the silane monomer.

Table II indicates the conditions under which the metal assisted CVD of a silicon-containing coating was achieved with the catalytic use of aluminum, magnesium, chromium, copper, zirconium or stainless steel.

Example 5

Using the procedure described in Example 1, diiodosilane, prepared by the procedure described above, was subjected to pyrolysis with and without aluminum metal catalysis. At 550° C., without aluminum metal catalysis, no silicon containing coating was deposited, however at 550° C. in the presence of aluminum foil as a metal catalyst, a silicon-containing film was deposited. Analogous results were obtained using $HSiCl_3$ and $SiCl_4$ as the starting silane monomer. See Table III.

TABLE III
Conventional CVD vs. Al Assisted CVD

| Sample Number | Silane Monomer | Condition °C. | CVD Method | Results Silicon-Containing Coating | No Coating |
|---|---|---|---|---|---|
| 1A | $H_2SiI_2$ | 550 | CCVD | — | x |
| 1B | $H_2SiI_2$ | 550 | ACVD | x | — |
| 2A | $HSiCl_3$ | 434 | CCVD | — | x |
| 2B | $HSiCl_3$ | 434 | ACVD | x | — |
| 3A | $SiCl_4$ | 550 | CCVD | — | x |
| 3B | $SiCl_4$ | 550 | ACVD | x | — |
| 4A | $H_2SiCl_2$ | 450 | CCVD | — | x |
| 4B | $H_2SiCl_2$ | 450 | ACVD | x | — |

Table III illustrates that the conventional CVD process (CCVD) i.e., without catalytic solid metal, did not produce silicon-containing coatings under the stated pyrolysis conditions while the metal assisted CVD (ACVD) process of the present invention did produce silicon-containing coatings on the glass substrates.

Example 6

Using the procedure described in Example 2, hexafluorodisilane, $F_3SiSiF_3$, was substituted for the silicon monomer and was thermally decomposed. In the presence of the aluminum foil catalyst, a silicon-containing coating was deposited onto a glass substrate.

That which is claimed is:

1. A method of forming silicon-containing coatings on a solid substrate, which method comprises decomposing in a reaction chamber a halosilane, halodisilane, or mixture of halosilanes in the vapor phase, in the presence of a metal catalyst and a substrate, at a temperature in the range of 400 degrees to 600 degrees Centigrade, wherein the halosilane, halodisilane, or halosilanes each contain at least one halogen atom selected from the group consisting of fluorine, chlorine, bromine, and iodine, and wherein the catalyst is selected from the group consisting of chromium, magnesium, stainless steel, copper, and zirconium, whereby a substrate containing a coating thereon is obtained.

2. A method as claimed in claim 1 wherein the temperature range is from 400 degrees Centigrade to 500 degrees Centigrade.

3. A method as claimed in claim 1 wherein the temperature range is from 400 degrees Centigrade to 450 degrees Centigrade.

4. A method as claimed in claim 1 wherein the substrate is glass.

5. A method as claimed in claim 1 wherein the substrate is a salt.

6. A method as claimed in claim 1 wherein the substrate is a metal.

7. A method as claimed in claim 6 wherein the metal is aluminum.

8. A method as claimed in claim 6 wherein the metal is steel.

9. A method as claimed in claim 6 wherein the metal is a silicon wafer.

10. A method of forming a titanium silicide coating on a solid substrate which method comprises decomposing in a reaction chamber, essentially simultaneously, (A) a halosilane, halodisilane, or mixture of halosilanes, and (B) a titanium halide or mixture of titanium halides, in the vapor phase, in the presence of a metal catalyst, and a solid substrate, at a temperature in the range of 400 degrees to 600 degrees Centigrade, wherein the halosilanes and halodisilanes, and titanium halides each contain at least one halogen atom selected from the group consisting of fluorine, chlorine, bromine, and iodine, wherein the metal catalyst is selected from the group consisting of aluminum, chromium, magnesium, stainless steel, and zirconium, whereby a substrate containing a coating thereon is obtained.

11. A method of forming a silicon carbide coating on a solid substrate which method comprises decomposing in a reaction chamber, essentially simultaneously, (A) a halosilane, halodisilane, or mixture of halosilanes, in the vapor phase, wherein the halosilanes and halodisilanes used contain at least one halogen atom per molecule selected from the group consisting of fluorine, chlorine, bromine, and iodine, and (B) an alkyl halide or mixture of alkyl halides wherein the alkyl halides each contain at least one halogen atom per molecule selected from the group consisting of fluorine, chlorine, bromine, and iodine, in the vapor phase, in the presence of a metal catalyst and a substrate, at a temperature in the range of 400 degrees to 600 degrees Centigrade, wherein the metal catalyst is selected from the group consisting of aluminum, chromium, magnesium, stainless steel, copper and zirconium, whereby a substrate containing a coating thereon is obtained.

12. A method of forming silicon-containing coatings on a solid substrate, which method comprises decomposing in a reaction chamber a halosilane, halodisilane, or mixture of halosilanes in the vapor phase, in the presence of aluminum foil catalyst and a substrate, at a temperature in the range of 400 degrees to 600 degrees Centigrade, wherein the halosilane, halodisilane, or halosilanes each contain at least one halogen atom selected from the group consisting of fluorine, chlorine, bromine, and iodine, whereby a substrate containing a coating thereon is obtained.

* * * * *